(12) United States Patent
Seki et al.

(10) Patent No.: US 7,927,089 B2
(45) Date of Patent: Apr. 19, 2011

(54) MOLD, APPARATUS INCLUDING MOLD, PATTERN TRANSFER APPARATUS, AND PATTERN FORMING METHOD

(75) Inventors: Junichi Seki, Yokohama (JP); Masao Majima, Isehara (JP); Nobuhito Suehira, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 167 days.

(21) Appl. No.: 11/447,857

(22) Filed: Jun. 7, 2006

(65) Prior Publication Data

US 2006/0279022 A1 Dec. 14, 2006

(30) Foreign Application Priority Data

Jun. 8, 2005 (JP) ................................. 2005-167919

(51) Int. Cl.
*B29C 59/00* (2006.01)
*B29C 35/08* (2006.01)
*B28B 17/00* (2006.01)
(52) U.S. Cl. ..... 425/143; 425/384; 425/385; 425/174.4; 264/293
(58) Field of Classification Search ............... 425/384, 425/385, 174.4, 174.6, 143; 264/293
See application file for complete search history.

(56) References Cited

U.S. PATENT DOCUMENTS

| | | | |
|---|---|---|---|
| 5,705,793 A * | 1/1998 | Kitaichi et al. ............... | 219/544 |
| 5,772,905 A | 6/1998 | Chou ............................. | 216/44 |
| 5,834,037 A * | 11/1998 | Wu .......................... | 425/174.8 R |
| 6,334,960 B1 | 1/2002 | Willson et al. ................ | 216/52 |
| 6,471,501 B1 * | 10/2002 | Shinma et al. ................ | 425/127 |
| 6,696,220 B2 | 2/2004 | Bailey et al. ................ | 430/272.1 |
| 7,140,861 B2 * | 11/2006 | Watts et al. .................. | 425/174.4 |
| 2003/0159608 A1 * | 8/2003 | Heidari ........................ | 101/494 |
| 2004/0149367 A1 * | 8/2004 | Olsson et al. ................... | 156/64 |
| 2004/0219461 A1 * | 11/2004 | Chung et al. .................. | 430/311 |

(Continued)

FOREIGN PATENT DOCUMENTS

JP A-2003-100625 4/2003

(Continued)

OTHER PUBLICATIONS

Chou, Stephen Y., et al. "Imprint of sub-25 nm vias and trenches in polymers," Appl. Phys. Left.., vol. 67, Issue 21, Nov. 20, 1995. pp. 3114-3116.

(Continued)

*Primary Examiner* — Maria Veronica D Ewald
(74) *Attorney, Agent, or Firm* — Fitzpatrick, Cella, Harper & Scinto

(57) ABSTRACT

A deformable mold includes a first surface at which an imprinting pattern is formed. The imprinting pattern (i) is used to imprint a pattern on a substrate and (ii) has a variable size, which varies based on an amount of deformation of the imprinting pattern. A second surface is located opposite from the first surface in a direction of thickness of the mold. A plurality of heat generating members that generate heat have a permeability to ultraviolet light and are disposed at one of (i) the second surface and (ii) between the first surface and the second surface, and the plurality of heat generating members directly contact the mold in order to control the amount of deformation of the imprinting pattern to vary the size of the imprinting pattern. A controller independently controls the plurality of heat generating members and the controller controls at least one of the heat generating members so as to effect anisotropic size correction of the mold in an in-plane direction of the mold.

12 Claims, 7 Drawing Sheets

U.S. PATENT DOCUMENTS

| | | | |
|---|---|---|---|
| 2006/0001194 A1* | 1/2006 | Cherala et al. | 264/320 |
| 2006/0198917 A1* | 9/2006 | Ho et al. | 425/174.4 |
| 2006/0272535 A1 | 12/2006 | Seki et al. | 101/492 |
| 2006/0273488 A1 | 12/2006 | Seki et al. | 264/293 |
| 2006/0279004 A1 | 12/2006 | Suehira et al. | 257/797 |
| 2006/0279022 A1 | 12/2006 | Seki et al. | 264/320 |

FOREIGN PATENT DOCUMENTS

| | | |
|---|---|---|
| JP | 2004-335808 | 11/2004 |
| WO | WO 2004/016406 A1 | 2/2004 |
| WO | WO 2004/044651 | 5/2004 |
| WO | WO 2004/062886 | 7/2004 |

OTHER PUBLICATIONS

Colburn, M., et al., "Step and Flash Imprint Lithography: A New Approach to High-Resolution Patterning," Emerging Lithographic Technologies III—Proceedings of the SPIE's 24th International Symposium on Microlithography, Yuli Vladimirsky, Editor, Santa Clara, CA, vol. 3676, Part One, Mar. 15-17, 1999. pp. 379-389.

Japanese Office Action dated Mar. 17, 2009, issued in corresponding Japanese Patent Application No. 2006-156014, with a partial English translation.

* cited by examiner

MOLD, APPARATUS INCLUDING MOLD, PATTERN TRANSFER APPARATUS, AND PATTERN FORMING METHOD

This application claims priority from Japanese Patent Application No. 2005-167919, filed Jun. 8, 2005, which is hereby incorporated by reference.

FIELD OF THE INVENTION AND RELATED ART

The present invention relates to a mold, an apparatus including the mold, a pattern transfer apparatus, and a pattern forming method.

As representative technology for transferring a desired pattern onto a substrate, light exposure technology used in a semiconductor process has been known.

In light exposure technology using ordinary light, a resolution is remarkably improved with, e.g., a shorter wavelength of light from a light source or progress in an optical system, so that a finer light exposure pattern is provided. Correspondingly, a finer semiconductor integrated circuit has been realized.

Currently, light exposure of a finer pattern of not more than 100 nm has been effected using an ArF excimer ($\lambda$=193 nm). Further, light exposure technology using an $F_2$ excimer laser ($\lambda$=157 nm) meeting a finer pattern and next generation light exposure technologies, such as extreme ultraviolet (EUV) exposure, X-ray exposure, and electron beam exposure, have been studied.

As described above, new fine processing technology has been proposed, while the light exposure technology proceeds toward next generation light exposure technology.

More specifically, as proposed in Appl. Phys. Lett., Vol. 67, Issue 21, pp. 3114-3116 (1995) by Stephan Y. Chou, et al., fine processing technology for transferring a minute structure on a mold onto a processing member, such as a resin or a metal, has been developed and has received attention. This technology is called nanoimprint or nanoembossing, and expectations are growing that the technology is used as next-generation semiconductor fabrication technology. Further, a space structure can be processed at a wafer level, as a whole, by the nanoimprint technology, so that the above-described (nanoimprint) technology has been expected to be applied to a wide variety of fields of production technologies of optical devices, such as photonic crystals and biochips, such as μ-TAS (Micro Total Analysis System).

In the publication, Processings of the SPIE's 24th International Symposium on Microlithography: Emerging Lithographic Technologies III, Santa Clara, Calif., Vol. 3676, Part One, pp. 379-389, March (1999), a minute structure is formed at a surface of a quartz substrate and utilized as a mold. More specifically, the mold is pressed against a substrate onto which an ultraviolet (UV) curable resin is applied, and is irradiated with UV light to cure the UV curable resin, thus transferring the minute structure onto the substrate.

Further, U.S. Pat. No. 6,696,220 has proposed a method of correcting a size of a mold by disposing a piezo (electric) actuator at a side surface of a mold (or template) and applying an external force to the side surface of the mold by means of the piezo actuator during correction of the size of the mold depending on a shape error with respect to a work.

Incidentally, when the fine processing is effected by the light exposure technology, a deformation of a pattern caused in the pattern itself can be corrected by optical magnification correction in the case where the pattern itself is deformed. In the case of the imprinting described above, however, pattern formation is effected by direct contact of the mold itself with the work, as described above, so that the optical correction method, as in the light exposure technology, cannot be utilized. These issues will be described more specifically while taking the case of being applied to a semiconductor fabrication process as an example.

In the case of the light exposure technology, first, a photosensitive resist is applied onto an Si wafer and, on the resist, an image of a reticle is formed with light by a light exposure apparatus. Thereafter, in a developing step, a resist pattern having a desired shape is obtained. Next, by using the resist pattern as a mask, at a desired position on the wafer, etching, film formation, ion implantation, polishing, and the like, are performed as desired. Then, onto the resultant wafer, the resist is applied again, a subsequent layer is positionally aligned with the already formed layer, so that they overlap with each other, followed by light exposure and repetition of similar steps.

The pattern formed above itself causes deformation due to an occurrence of film stress in the film forming step or an occurrence of thermal stress in the ion diffusion step. When a subsequent layer is formed by ignoring the deformation, even if there is no alignment error during the light exposure, there is a concern about a possibility of an occurrence of a deviation out of an acceptable range between the upper and lower layers, since the portion itself of the previous layer is deformed.

For this reason, in the light exposure apparatus, in order to correct the deformation occurring in the pattern itself, the apparatus has a function of effecting correction of magnification, optically, in some cases.

On the other hand, in the imprint processing technology, the pattern formation is performed by directly contacting the mold itself with a member to be processed (hereinafter, referred to as a "processing member"). As a result, it is difficult to use the optical correction method, such as the magnification correction by the light exposure apparatus.

For this reason, in U.S. Pat. No. 6,696,220 described above, as a correction method in place of the magnification correction by the light exposure apparatus, such a method that the piezo actuator is provided at the side surface of the mold (template) and the mold is compressed and deformed from the side surface side to correct a size of the mold is adopted.

In this case, however, the size correction is effected only by application of an external force from the mold side surface, so that there is a possibility of an occurrence of breakage of the mold at a portion where the mold and a chucking mechanism, including the piezo actuator, contact each other.

SUMMARY OF THE INVENTION

An object of the present invention is to provide a mold capable of effecting size correction and an apparatus including the mold.

Another object of the present invention is to provide a pattern transfer apparatus and a pattern forming method which utilize the mold.

According to an aspect of the present invention, there is provided a mold, comprising:

a first surface at which an imprinting pattern is formed;

a second surface located opposite from the first surface in a direction of thickness of the mold; and a heat generation member disposed at the second surface or between the first surface and the second surface.

According to another aspect of the present invention, there is provided an apparatus, comprising:

a mold having a first surface at which an imprinting pattern is formed and a second surface located opposite from the first surface in a direction of thickness of the mold; and a size adjusting member, disposed at the second surface or between the first surface and the second surface, for deforming the imprinting pattern in an in-plane direction of the first surface.

According to a further aspect of the present invention, there is provided a pattern transfer apparatus, comprising:

a mold holding portion for holding the mold described above;

a control portion for controlling an amount of electrical current to be passed through the heat generation member; and a support portion for supporting a member to be processed, onto which the imprinting pattern of the mold is transferred.

According to a still further aspect of the present invention, there is provided a pattern forming method of forming a pattern on a member to be processed using an imprinting pattern provided on a mold, the method comprising:

preparing the mold described above;

preparing the member to be processed disposed opposite to the mold;

adjusting a size of the mold using the heat generation member; and causing the imprinting pattern provided on the mold to contact the member to be processed.

The present invention also provides a mold, having a processing surface on which a transfer pattern is formed, characterized by containing a constituent, as a part thereof, capable of changing a size thereof.

The present invention further provides a process for producing a pressure processing mold for transferring a pattern onto a work, characterized by including a step of forming a light-transmissive heat generation layer at one surface of a pattern layer, a step of forming an electrode electrically connected with the heat generation layer, and a step of forming a pattern for transferring the work at a surface opposite from the pattern layer surface at which the heat generation layer is formed.

The present invention further provides a process for producing a pressure processing mold for transferring a pattern onto a work, characterized by including a step of forming a deformable electrode for driving a deformable layer comprising a piezoelectric element expandable or extendable in a direction parallel to one of the surfaces of a pattern layer, a step of forming the deformable layer on the deformable electrode, a step of forming a common electrode layer on the deformable layer, a step of forming on the common electrode layer another deformable electrode for driving a deformable layer comprising a piezoelectric element expandable in a direction different from the direction parallel to the one surface of the pattern layer, a step of forming another deformable layer expandably driven in the different direction on the other deformable electrode, and a step of forming a pattern to be transferred onto the work at a surface of the pattern layer opposite from the surface where at least two deformable layers described above are formed.

The present invention further provides a pressure processing apparatus, capable of size correction of a mold depending on a shape error with respect to the work during transfer of a pattern shape of the mold onto a work by pressing the mold against the work, characterized by including a mechanism for driving the above-described pressure processing mold or that produced through the above-described mold production process.

The present invention further provides a pressure processing method for processing a mold, while correcting a size of the mold depending on a shape error with respect to the work, during transfer of a pattern shape of the mold onto a work by pressing the mold against the work, characterized by including a step of effecting processing using the above-described pressure processing mold or that produced through the above-described mold production process.

According to the present invention, it is possible to realize a mold capable of effecting size correction, an apparatus including the mold, and a pattern transfer apparatus and a pattern forming method which utilize the mold.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 3A to 3D are schematic views for illustrating a constitution of a mold in Embodiment 1 of the present invention, wherein FIG. 3A is a schematic view of the apparatus viewed in a direction parallel to a processing surface (contacting a work), FIG. 3B is a schematic view of the apparatus viewed from a back surface side in a direction perpendicular to the processing surface, FIG. 3C is a schematic view for illustrating a constitutional example of a light-transmissive resistive layer, and FIG. 3D is a schematic view for illustrating an electrode arrangement constitution in another embodiment.

FIGS. 5A to 5D are schematic views for illustrating a mold in Embodiment 2 of the present invention, wherein FIG. 5A is a schematic view of the mold viewed from a back surface side in a different perpendicular to a processing surface (contacting a work) of the mold, FIGS. 5B and 5C are schematic views each for illustrating an operation of changing a size of the mold, and FIG. 5D is a schematic view for illustrating a constitutional example of a light-transmissive resistive layer.

FIGS. 6A and 6B are schematic views for illustrating a constitution of a mold in Embodiment 3 of the present invention, wherein FIG. 6A is a schematic view of the mold viewed in a direction parallel to a processing surface (contacting a work) of the mold, and FIG. 6B is a perspective view showing layers divided for illustrating constitutional elements of the mold.

DETAILED DESCRIPTION OF THE PREFERRED EMBODIMENTS

First Embodiment

Mold

A mold according to this embodiment will be described with reference to FIGS. 1A to 1C.

Figure 1A:
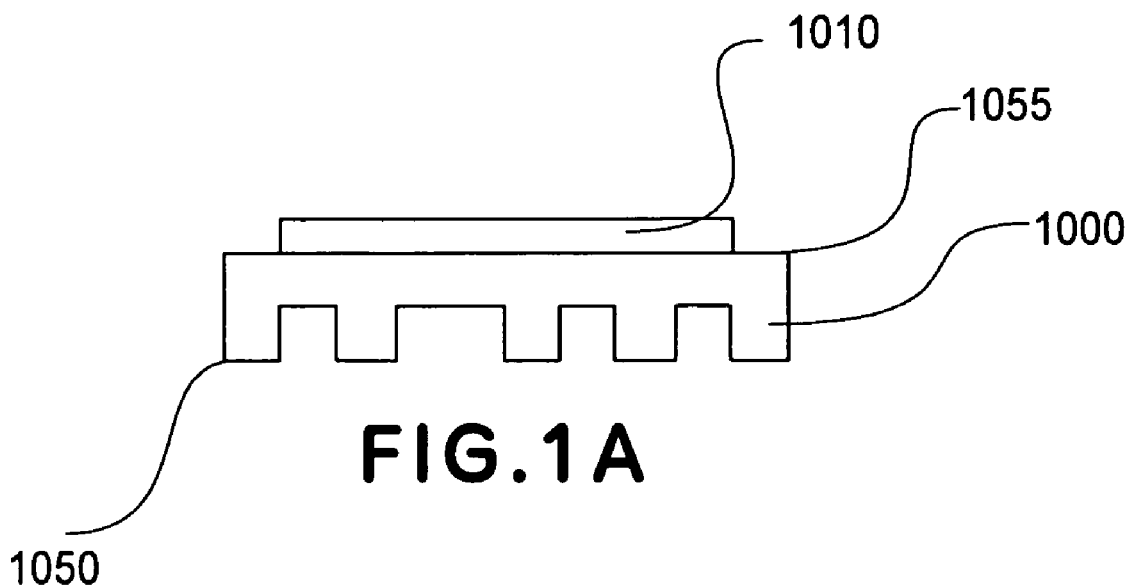
FIGS. 1A to 1C are schematic sectional views for illustrating a mold according to the present invention.
Figure 1B:
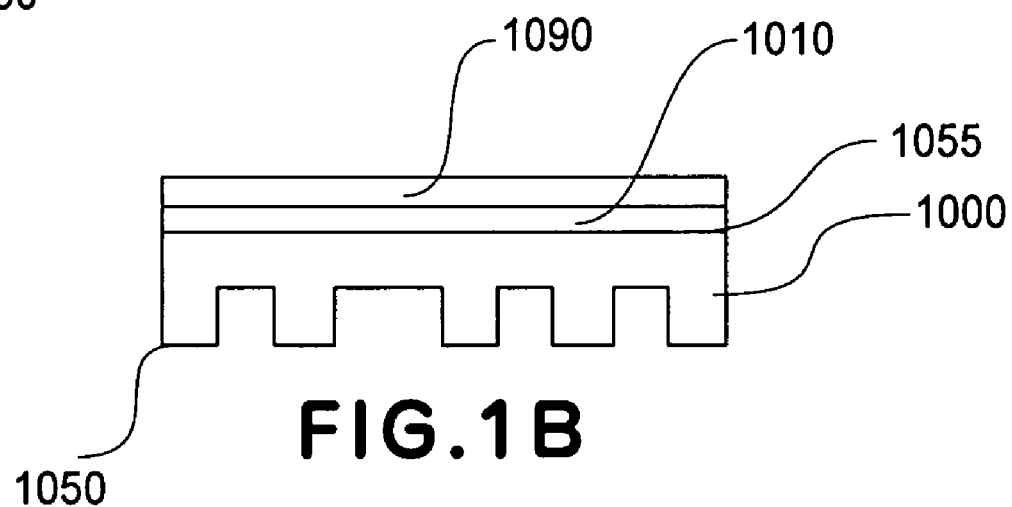

Referring to FIG. 1A, a mold 1000 has an imprinting pattern at a first surface 1050 thereof (herein, also referred to as a "processing surface"), and is provided with a heat generation member 1010 for changing a size of the mold at a second surface 1055, opposite from the first surface 1050, in a direction of a thickness of the mold.

A position and a size of the heat generation member 1010 are not particularly limited, so long as a size of the imprinting pattern can be changed. The heat generation member 1010 may be disposed partially when the cross section of the mold in the thickness direction is viewed, as shown in FIG. 1A, or at the entire surface of the second surface, as shown in FIG. 1B. Further, as shown in FIG. 1B, on the heat generation member 1010, a coating film 1090 covering the heat generation member 1010 may be disposed. Incidentally, the thickness direction is a direction perpendicular to the first surface and the second surface.

The heat generation member is not necessarily required to be located at the second surface, but may also be located between the first surface and the second surface. The first surface itself may also be constituted by a material identical to a material constituting the mold.

Figure 1C:
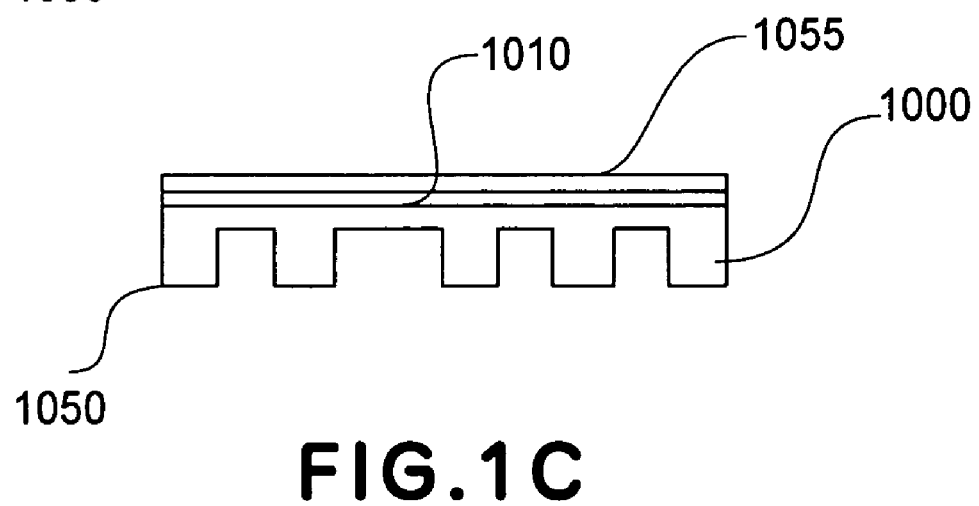

Further, the heat generation member 1010 may also be embedded in the mold as shown in FIG. 1C. In order to effect the size correction of the mold, the heat generation member may preferably be located closer to the first surface 1050.

The embedded heat generation member, as shown in FIG. 1C, may, e.g., be formed by ion implantation of phosphorus, arsenic, antimony, boron, etc., to create a p+ or an n+ portion in an area thereof after the mold is formed of silicon. By passing a current through the heat generation member area, the portion in the heat generation member area is caused to function as the heat generation member.

In the case wherein the heat generation members 1010 shown in FIGS. 1A to 1G generate heat by electrical current passage, an electrode for passing the current may be provided to the mold itself, or at a holder portion when the holder portion can be electrically connected to the heat generation member.

The heat generation member may, e.g., be a resistive film, which generates heat by electrical current passage or a heat generation member utilizing electromagnetic induction.

In an imprint method (imprinting) using a photocurable resin, the mold may be constituted by a light-transmissive substance, such as quartz, pyrex (registered trademark), or sapphire. In the case wherein the mold is not required to be light transmissive, it is also possible to use a metallic material, such as Ni, Cr, silicon, etc.

The mold in this embodiment is configured to permit correction of the size of the imprinting pattern by heat conduction from the heat generation member to the imprinting pattern. By utilizing the heat conduction, it is possible to readily heat the mold at a higher rate than when compared with the case of utilizing radiation.

The heat generation member may be provided in a plurality of heat generation members at the second surface, or between the first surface and the second surface, as shown in FIGS. 5A to 5D (to be specifically described later).

As shown in FIGS. 5A to 5D, light-transmissive resistive layers 301, 302, 303 and 304, as the heat generation members, are provided at a back surface of the mold, whereby it is possible to effect not only isotropic size correction of the mold in an in-plane direction of the back (second) surface of the mold, but also, anisotropic size correction by appropriately selecting the light-transmissive resistive layer through which the electrical current is caused to pass. In the embodiment shown in FIGS. 5A to 5D, four heat generation members are used, but, by utilizing five or more heat generation members, it is possible to effect stricter size correction.

In the case of using the plurality of heat generation members, it is desirable that they are capable of being heat-controlled independently of each other. Further, the heat generation members may preferably be disposed at plural portions in an in-plane direction of the first surface.

The above-described heat generation members may desirably have a light-transmissive property, although it varies depending on an imprint method to which the heat generation member is applied. For example, in the case where a pattern is transferred onto an ultraviolet curable resin, the heat generation member is formed of a material less absorbent to ultraviolet rays.

Heat dissipation to the outside of the mold is suppressed by embedding the heat generation member in the mold (FIG. 1C) or interposing the heat generation member between the mold and another layer, so that it is possible to effectively transfer heat from the heat generation member to the imprinting pattern.

In this embodiment, by adopting the above-described constitution, the mold itself has a deforming function, so that the size of the mold can be changed isotropically or partially, depending on a shape error with respect to a work, thus being corrected appropriately.

For example, when the mold size is isotropically changed, a light-transmissive heat generation layer (electrical resistive layer) is formed at a surface opposite from the processing surface of a pattern layer formed of a transparent material, and is configured to be electrically connected to an electrode. As a result, the electrode is driven to pass the electrical current through the resistive layer, to cause the resistive layer to generate heat, thus heating the mold to be thermally expanded. In this manner, the entire mold is expanded, so that it is possible to correct the shape error with respect to the work.

When the mold size is partially changed, the light-transmissive heat generation layer (electrical resistive layer) formed at the surface opposite from the processing surface of the pattern layer is divided into a plurality of portions in a direction of the processing surface, so that the divided portions are independently configured to be capable of drive-controlling the electrode. As a result, the mold can be deformed in a complicated shape, thus meeting various shape errors.

In this embodiment, such a constitution that the electrical current is passed through the resistive layer to generate heat is employed, but the present invention is not limited to such resistive heating. For example, at the surface opposite from the processing surface of the pattern layer, an electroconductive layer causing induction heating is formed, instead of the heat generation layer described above.

In the case of using the heat generation member, the mold can only be deformed in such a direction that the mold size is increased. However, by adopting such a mold that it has an imprinting pattern prepared in advance by reducing a size of a pattern to be transferred, it is possible to effect substantial size correction of the mold. Further, in this embodiment, in place of the above-described heat generation member, it is also possible to use a thermoelectric element, such as a Peltier element, having a heat absorbing or cooling function.

Incidentally, as will be described in detail in the Second Embodiment described below, it is also possible to use the technology described in U.S. Pat. No. 6,696,220, i.e., the technology in which the external force is applied from the side surface of the mold by the piezoelectric actuator, in combination. In such a case, the mold size (or the pattern size)

can be changed without utilizing only the external force applied from the side surface of the mold, so that the constitution of this embodiment is effective.

The amount of deformation of the size of the mold can be controlled by preliminarily preparing and utilizing a data base for a relationship between temperature and size (or an amount of change in size) of the mold.

Second Embodiment

Apparatus Including Mold and Size Adjusting Member

An apparatus including a mold and a size adjusting member according to this embodiment will be described with reference to FIG. 2.

Figure 2:
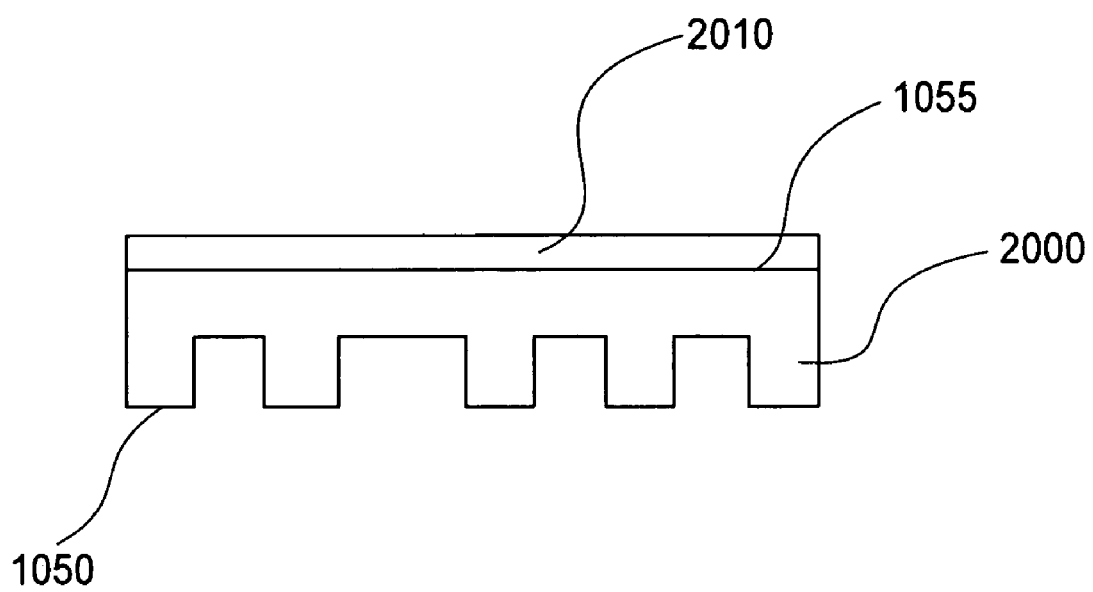
FIG. 2 is a schematic sectional view for illustrating an apparatus including a mold and a size adjusting member according to the present invention.

Referring to FIG. 2, a mold 2000 has a first surface 1050 at which an imprinting pattern is formed, and a second surface 1055, opposite from the first surface 1050.

At the second surface 1055, a size adjusting member 2010 for deforming the imprinting pattern in an in plane direction of the first surface is provided. As described above in the First Embodiment, with reference to FIGS. 1A to 1D, the size adjusting member 2010 may also be provided at the second surface or between the first surface and the second surface.

The size adjusting member may, e.g., be a deformable layer expandable in the in-plane direction of the first surface (or the second surface). Such a deformable layer may also be provided in a plurality of deformable layers. For example, the size adjusting member may be constituted by a first deformable layer and a second deformable layer, different in expandable direction from the first deformable layer. As the deformable layer, it is possible to use a piezoelectric element layer.

The two deformable layers can also be disposed at two divided positions in the in-plane direction, similarly, as in the case of the heat generation members described with reference to FIGS. 5A to 5D, but may also be laminated in the following manner.

For example, the two deformable layers are configured to be expandably driven in two different directions in the in-plane direction of the surface parallel to the processing surface of the pattern layer, i.e., in the in-plane direction of the first surface.

Further, two deformable layers comprising a piezoelectric element are provided, and a voltage is applied to these deformable layers independently of each other, whereby it is possible to effect direction control of the deformable layers in two different directions. In the case of using the piezoelectric element, it is possible to effect correction of an anisotropic shape error, without causing a temperature change.

Further, the size adjusting member 2010 is provided at the second surface 1055 and, on the size adjusting member 2010, a support member may preferably be laminated of the same material as the mold in the same thickness as the mold.

In this embodiment, as the size adjusting member, it is also possible to use the heat generation member used in the First Embodiment.

More specifically, as the size adjusting member, it is possible to employ an element utilizing a thermoelectric effect, such as a Peltier element or an element having a heat absorbing function or a cooling function. It is also possible to use the heat generation member and Peltier element in combination.

Further, in this embodiment, the technology described in U.S. Pat. No. 6,696,220, i.e., the technology, in which the external force is applied from the side surface of the mold, can also be used in combination. In this case, in order to prevent breakage of the mold, the mold size is corrected by reducing the external force applied to the mold by means of the piezo actuator, and an insufficient amount of the size correction thereby is compensated for by the size adjusting member, such as the above-described heat generation member, the deformable layer, or Peltier element. More specifically, after the mold size is corrected by the size adjusting member, an external force (stretching or compression) can be applied to the side surface of the mold by the piezo actuator to effect the size correction of the mold. This can also be performed in reverse order. In other words, size adjustment (size correction) is effected by using two correction mechanisms for effecting a correction from the back surface side of the mold (from the second surface side of the mold or from the inside of the mold) and a correction from the side surface of the mold.

Figure 7A:
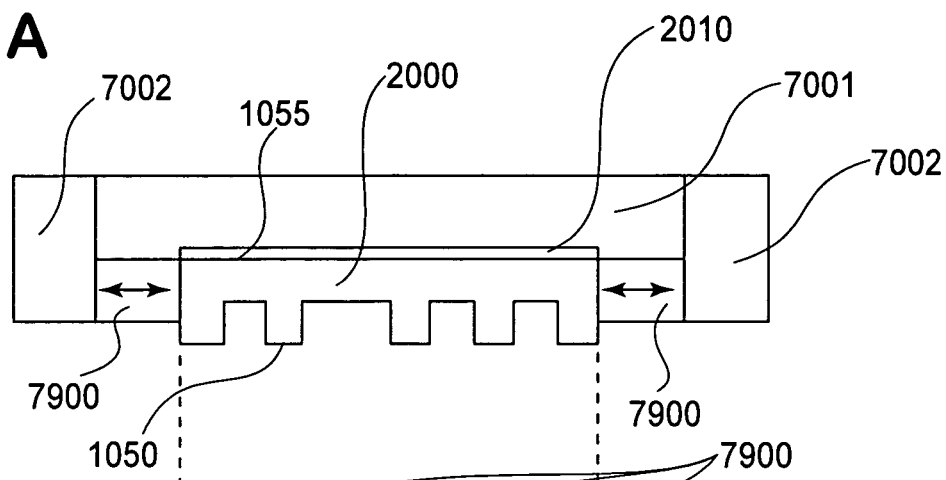
FIGS. 7A and 7B are a schematic sectional view and a plan view, respectively, for illustrating an apparatus including a mold and a size adjusting member according to the present invention.
Figure 7B:
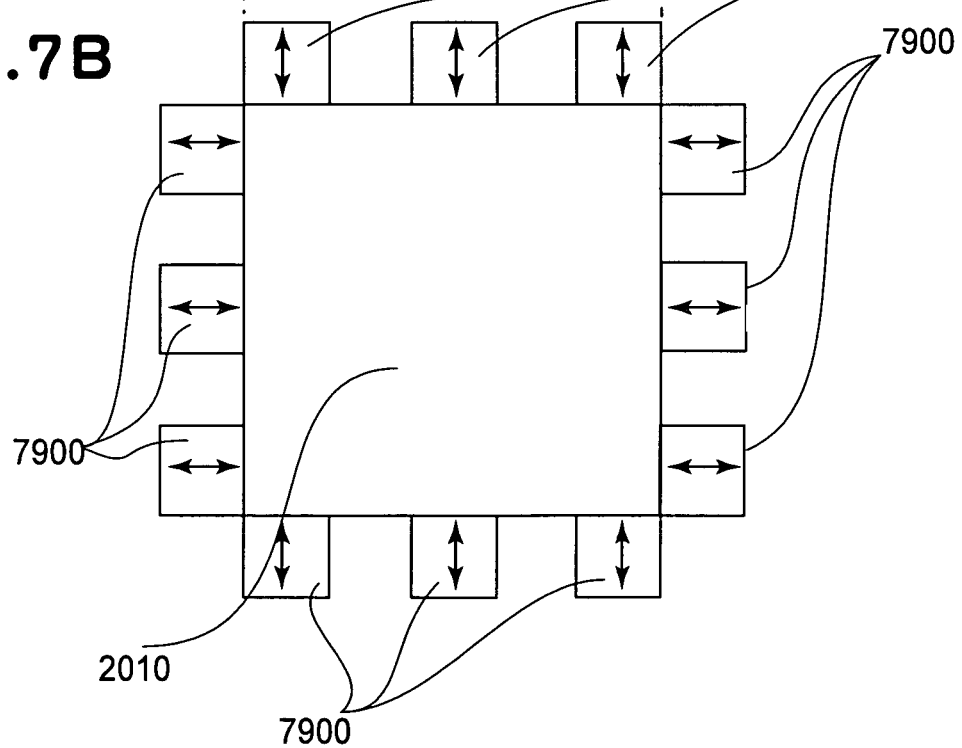

In FIGS. 7A (sectional view) and 7B (plan view), piezo actuators 7900 for applying an external force from side surfaces of the mold 2000 are disposed at the side surfaces of the mold 2000. On the mold 2000, a size adjusting member 2010 is disposed. The mold 2000 is supported by a back surface-side support portion 7001 and a side surface-side support portion 7002. In FIG. 7B, the size adjusting member is depicted so as to be visible. Thus, the support portions 7001 and 7002 are omitted. As shown in FIG. 7B, the piezo actuators 7900 are provided at a plurality of portions at the side surfaces of the mold. These piezo actuators, comprising the piezoelectric element, may preferably be controllable independently of each other.

Third Embodiment

Pattern Transfer Apparatus

This embodiment relates to a pattern transfer apparatus constituted by utilizing the mold described in the First Embodiment or the apparatus including the mold and the size adjusting member described in the Second Embodiment.

Details thereof are described in the Embodiment described later with reference to FIG. 4. The pattern transfer apparatus includes a mold holding portion 250 for holding the mold and a control portion for controlling an amount of correction (or amount of electrical current caused to pass through the heat generation member or an amount of adjustment by the size adjusting member).

The resultant apparatus can be utilized in a photoimprint method using a photocurable resin or a thermal imprint method.

Fourth Embodiment

Pattern Forming Method

A pattern forming method is a method of forming a pattern on a member to be processed.

More specifically, the mold or the apparatus described in the First Embodiment or the Second Embodiment is prepared.

Next, the member to be processed is disposed opposite to the mold.

Then, a size of the mold is adjusted by the size adjusting member, such as the heat generation member described above.

In the size adjusted state, an imprinting pattern of the mold and the member to be processed are caused to contact each other.

Thereafter, the pattern is transferred by irradiation with light, such as ultraviolet rays or application of heat. For example, the imprinting pattern of the mold is transferred onto a resin or a resist disposed on a silicon substrate.

Here, the member to be processed is also called a work, and means a substrate itself or a member comprising a substrate and coating layer disposed on the substrate.

Examples of the substrate may include a semiconductor substrate, such as an Si substrate or a GaAs substrate, a resin coated semiconductor substrate, a resinous plate, a glass substrate, etc. It is also possible to use a multi-layer substrate comprising one of these substrates, and a thin film grown or laminated on the substrate or a light-transmissive substrate, such as a quartz substrate.

The resin used as a coating material for the coating layer is cured by, e.g., irradiating it with light, such as ultraviolet rays from the mold side. Examples of such a photocurable resin may include those of a urethane type, an epoxy type, and an acrylic type.

This embodiment is not limited to the photoimprint method, but is applicable to other methods using a thermosetting resin, such as phenolic resin, epoxy resin, silicone resin or polyimide, and using a thermoplastic resin such as polymethyl methacrylate (PMMA), polycarbonate (PC), PET, or acrylic resin. As the coating material, it is also possible to use polydimethylsiloxane (PDMS). The pattern transfer can also be directly performed on the quartz substrate or the silicon substrate.

Hereinafter, the present invention will be described more specifically based on Examples.

Embodiment 1

In Embodiment 1, a pressure processing mold, capable of isotropically effecting correction of a size of the entire mold by applying the present invention, is prepared.

Figure 3A:
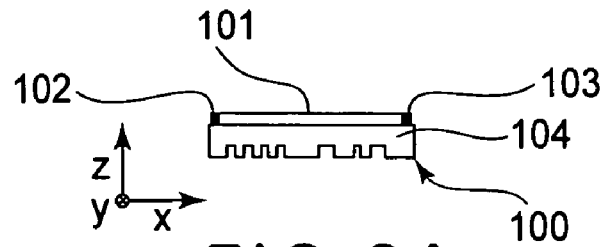
Figure 3B:
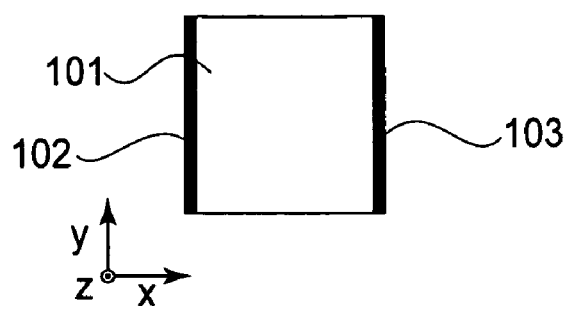

FIGS. 3A and 3B show a constitution of a mold in this embodiment, wherein FIG. 3A is a schematic view of the mold viewed in a direction parallel to a processing surface of the mold (contacting work) and FIG. 3B is a schematic view of the mold viewed from a back surface side in a direction perpendicular to the processing surface.

Referring to these figures, a mold 100 includes a light-transmissive resistive layer 101, an electrode (a) 102, an electrode (b) 103, and a light-transmissive pattern layer 104.

At a processing surface of the light-transmissive pattern layer 104, a desired shape is provided as minute projections or recesses. On an opposite side from the processing surface, the light-transmissive resistive layer 101 is integrally formed with the pattern layer 104, and is provided with the electrode (a) 102 and the electrode (b) 103, which are used for ensuring good electrical connection to the apparatus, at two opposite sides of four sides thereof.

Next, an example of a process for producing the mold 100 in this embodiment will be described.

First, a quartz wafer constituting the pattern layer 104 is cut into a square, and is covered with a metal mask at two sides thereof, and a layer of indium tin oxide (ITO) is formed in a film by sputtering as the light transmissive resistive layer 101.

Next, a layer of good resulting in the electrode (a) 102 and the electrode (b) 103 is formed by vacuum deposition in a thickness of not less than that of the ITO film, followed by polishing, until the entire ITO film is exposed.

Next, onto a surface opposite from the surface where the above-described processing is performed, an electron beam resist is applied, and a desired pattern is formed by an electron beam lithography system. After development, the pattern layer 104 is etched by dry etching.

Finally, the remaining resist is removed by washing or solvent cleaning to complete the mold 100 shown in FIG. 3A or 3B.

Figure 3C:
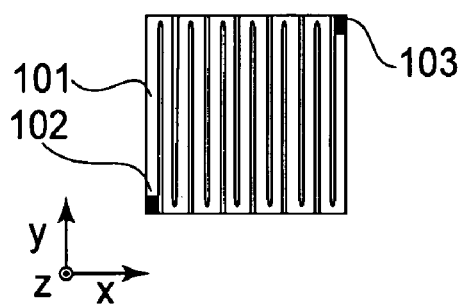

FIG. 3C shows a constitutional example of the light-transmissive resistive layer 101 used in this embodiment.

In this embodiment, the light-transmissive resistive layer 101 is formed in a folded shape as shown in FIG. 3C. The light-transmissive resistive layer 101 having such a folded shape may be formed by using a folded shaped mask during the ITO film formation or effecting such patterning after the ITO film formation. By forming the folded-shaped, light-transmissive resistive layer 101, it is possible to make uniform an amount of electrical current flowing at a respective portions, irrespective of a resistance ratio of the electrodes (a) 102 and (b) 103 to the light-transmissive resistive layer 101. As a result, a production cost of the mold is somewhat increased, but an effective constitution for making uniform an amount of heat generation can be ensured.

Incidentally, the materials and the processing methods for the respective members are not limited to those described above. For example, it is also possible to use, in place of the quartz wafer, a substrate of another light-transmissive material, such as a sapphire substrate. Further, instead of ITO, another light transmissive resistive material, such as indium zinc oxide (IZO), can also be used. Alternatively, a layer of metallic material, such as Ta, may be formed in a thin film, so that it permits transmission of a necessary amount of light.

Further, with respect to the processing method, it is also possible to apply a desired method, such as FIB processing or photolithography, in place of the electron beam lithography.

Further, the light-transmissive resistive layer 101 may also be configured to be in contact with contacts of the apparatus, without forming the electrodes (a) 102 and (b) 103, so that an effective constitution for reducing the mold production cost can be ensured, although it is inferior in electrical connection performance to the electrodes.

Figure 3D:
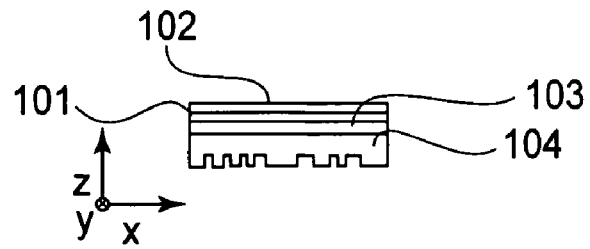

Further, another constitution can also be taken with respect to the electrode arrangement, as shown in FIG. 3D.

As shown in FIG. 3D, it is also possible to laminate the light-transmissive electrode (a) 102 and the light-transmissive electrode (b) 103, while interposing the light-transmissive resistive layer 101 therebetween, in a direction perpendicular to the processing surface. In this case, a resultant light-transmissive performance can be lowered due to an increase in thickness, but the back surface of the mold (opposite from the pattern layer 104) is constituted by only the electrode (a) 102, so that it is possible to readily ensure flatness without employing the polishing step, or the like. For this reason, an effective constitution can be ensured in the cases requiring a reduction in cost of the mold and, particularly, flatness, and in the case wherein the pattern layer 104 has already been formed.

Next, a pressure processing apparatus, including the mold in this embodiment, will be described.

Figure 4:
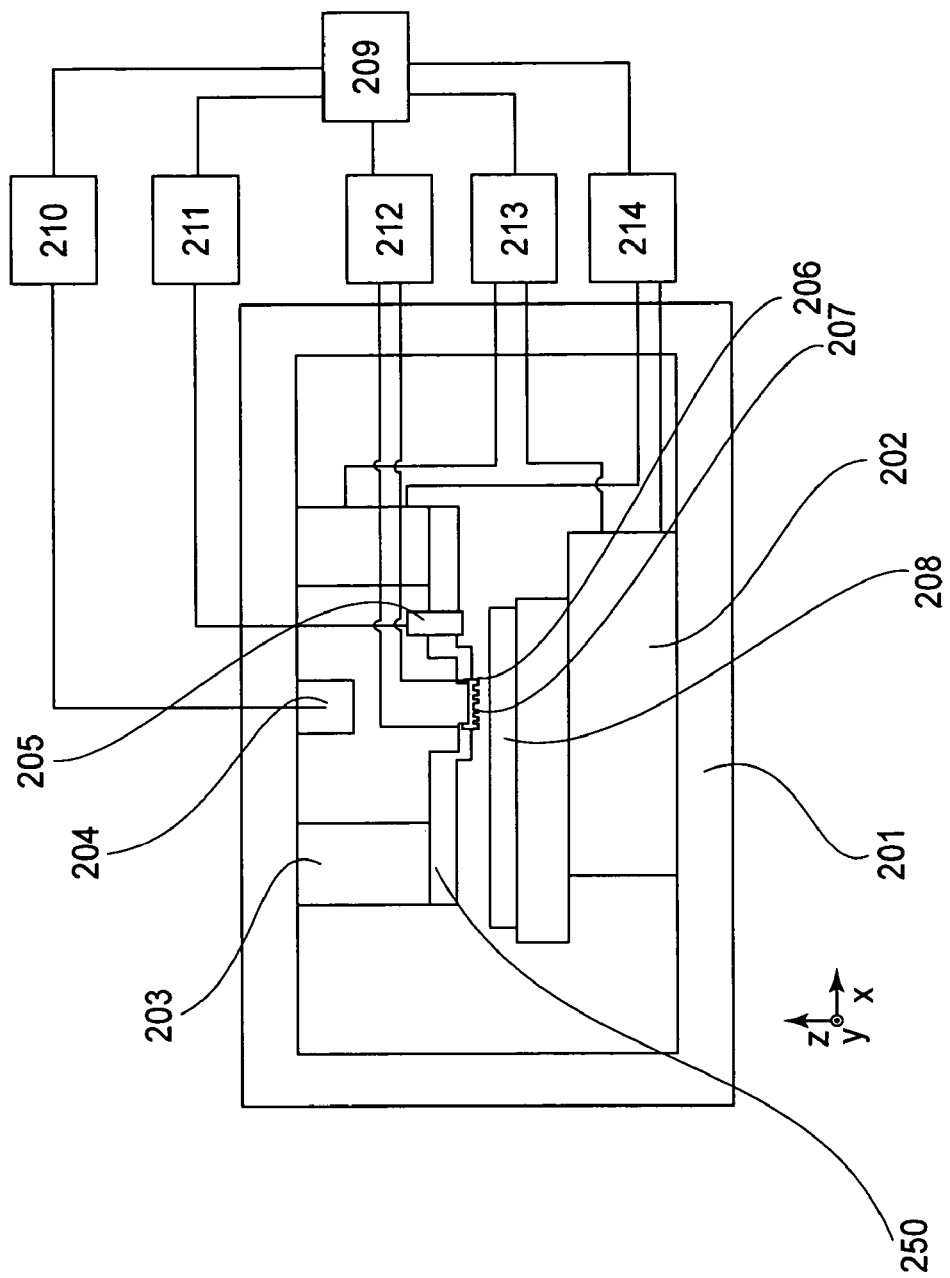
FIG. 4 is a schematic view for illustrating a constitution of a pressure processing apparatus in Embodiment 1 of the present invention.

FIG. 4 shows a constitution of the pressure processing apparatus, including the mold in this embodiment. This pressure processing apparatus corresponds to the pattern transfer apparatus described in the above-described embodiment.

Referring to FIG. 4, the apparatus includes a housing 201, an x, y, θz drive mechanism 202, a z, θx, θy drive mechanism 203, a UV light source 204, a scope 205, a correction contact 206, a mold 207 used in the above-described embodiment, a work 208, a process control circuit 209, an exposure amount control circuit 210, a correction amount detection circuit 211, a correction amount control circuit 212, an attitude control circuit 213, a position control circuit 214, and a mold holding portion 250.

As shown in FIG. 4, the mold 207 described in the above embodiment and the work 208 of the Si wafer coated with a photocurable resin are disposed opposite to each other.

The mold 207 and the scope 205 are connected to the z, θx, θy drive mechanism 203 via members including a mounting portion, of the mold 207, provided with the correction contact 206 for ensuring an electrical connection by contacting the electrode (a) 102 and the electrode (b) 103. The scope 205 is constituted by a lens system and a CCD camera, and obtains information about the surface of the work 208 as an image. The work 208 is attached to the x, y, θz drive mechanism 202, which is connected with the z, θx, θy drive mechanism 203 via the housing 201. To a portion of the housing 201, opposite to the back surface of the mold 207, the UV light source 204 is attached.

The process control circuit 209 provides instructions to the exposure amount control circuit 210, the correction amount detection circuit 211, the correction amount control circuit 212, the attitude control circuit 213, and the position control circuit 214 to continue a process, and receives output data from these circuits. The exposure amount control circuit 210 controls the UV light source 204 to effect light exposure. The correction amount detection circuit 211 calculates an amount of correction from a detection signal from the scope 205, and the correction amount control circuit 212 energizes the mold 207 through the correction contact 206 to deform the mold 207. The attitude control circuit 213 and the position control circuit 214 drive the x, y, θz drive mechanism 202 and the z, θx, θy drive mechanism 203, respectively, so that they can control a relative attitude and a relative position between the mold 207 and the work 208. Incidentally, mechanical arrangements of the respective axes x, y, z, θx, θy and θz are not limited to those in this embodiment, but may also be appropriately determined as a matter of design choice.

Next, the pressure processing process in this embodiment will be described.

First, by using the z, θx, θy drive mechanism 203, the mold 207 is pressed against the work 208. Then, after the photocurable resin is cured by irradiation with UV light from the UV light source 204, the mold 207 is removed from the work 208 to transfer an imprinting pattern at the processing surface of the pattern layer 104 onto the work 208.

The pattern at the processing surface of the pattern layer 104 includes an alignment mark (not shown), which is also transferred together with a desired pattern onto the work 208. The alignment mark has a shape, which is selected appropriately from those, such as a cross or a rectangle, conventionally used for the light exposure apparatus, and can be provided as the imprinting pattern or a change in constituting material.

A size (angle of view) of the processing surface of the mold 207 may appropriately be selected, but is taken as 25 mm×25 mm (square) in this embodiment, for illustration purposes. The above-described steps of pressing, light exposure, and removal are repetitively performed while moving the mold 207 and the work 208 relative to each other in the in plane direction of the work 208 by means of the z, θx, θy drive mechanism 203 to fill the surface of the work 208 with a transferred pattern every 25 mm-square area, similarly as in the case of the stepper, the scanner, or the like, as a representative light exposure apparatus. Incidentally, in the case wherein high throughput is required, it is also possible to process the entire work by one operation by preparing a work-size mold 207, although a mold production cost is increased. Thereafter, by using the imprinting pattern provided on the work 208 as a resist pattern, an ordinary semiconductor production step is performed to complete formation of a first layer.

Next, the mold 207 is changed to that for a second layer. The first layer formed on the work 208 is again coated with a photocurable resin, and the work 208 is mounted on the x, y, θz drive mechanism 202.

Then, in the same manner as in the case of the representative light exposure apparatus, such as the stepper or the scanner, respective amounts of errors are measured by detecting the alignment mark of the first layer. In this embodiment, a focus of the scope 205 is adjusted by the z, θx, θy drive mechanism 203, after the work 208 is moved by the x, y, θz drive mechanism 202, and the alignment mark of the first layer is imaged.

This operation is effected with respect to a plurality of alignment marks, and then, the resultant respective images are processed by the correction amount detection circuit 211. Further, from the results thereof, and an amount of movement of the x, y, θz drive mechanism 202, an amount of deformation of the pattern occurring in the first layer forming step is calculated. Further, by the same processing, amounts of errors of x, y, θz are calculated. From the focus position of the scope 205 and an amount of movement of the x, y, θz drive mechanism 202, amounts of errors of z, θx, θy are calculated. These are used as amounts of correction of the attitude control circuit 213 and the position control circuit 214. Incidentally, the amount of deformation of the pattern occurring in the first layer forming step may also be measured by a separately prepared measuring apparatus, such as length measurement SEM, and measured data thereof may be used.

Here, correction of the deformation amount between the first layer and the second layer will be explained.

At the processing surface of the pattern layer 104 of the mold 207 for the second layer, a pattern, generally reduced in size, which is smaller than an estimated amount of deformation (expansion or contraction) of the pattern occurring in the first layer forming step with respect to the mold for the first layer, is prepared.

The correction amount control circuit 212 sends an electrical current corresponding to the detected deformation amount to the light-transmissive resistive layer 101, thus causing the light-transmissive resistive layer 101 to generate heat, thereby to heat the entire mold 207.

The heated mold 207 is expanded by thermal expansion, so that the pattern at the processing surface of the pattern layer 104 is constituted in a size corresponding to the deformation amount of the first layer.

For example, a pattern, for the second layer, generally reduced in size by five ppm is used. In the case where the pattern layer 104 is formed of quartz having a coefficient of linear expansion of $0.5 \times 10^6$, when the first layer is contracted by two ppm as a result of the above-described measurement, it is possible to match the pattern sizes of the first layer and the second layer with each other, by increasing a temperature of the mold 207 by 6° C. under heating. Further, e.g., in the case where the deformation amount exceeds the estimated amount, it is also possible to accommodate such a case by expanding the mold during the processing of the first layer without remaking the mold for the second layer (and subsequent layer). In the case where the first layer is contracted by seven ppm, the work has no other choice but to be disposed. However, by using a new work 208, it is possible to accommodate such a case by performing again the succession of proceeding after the mold for the first layer is expanded by not less than two ppm by means of a new work 208.

In order to heat the mold 208, it is also considered that a heating method of heating the mold by heat conduction from the mold mounting portion is used as a method other than that in this embodiment. In this method, however, a distance from the mold mounting portion to a center portion of the mold is larger, so that it is difficult to keep the temperature uniform. Further, the heating method has no other choice, but to heat members other than the mold, so that a heat capacity is large, thus resulting in a low response speed.

On the other hand, in the method in this embodiment, the heat generation portion extends over the entire back surface of the mold, and a length in a thickness direction, i.e., a heat conduction direction, is as small as not more than several millimeters, so that it is easy to keep the temperature uniform. Further, a portion to be heated is only the mold, so that a heat capacity is small, thus resulting in a high response speed.

After the correction of the deformation amount, pattern transfer of the second layer is performed similarly as in the first layer, and other semiconductor production steps are performed. The above-described operations are repeated for a desired number of layers to complete a device.

Incidentally, in the processing apparatus shown in FIG. 4, it is also possible to adjust an amount of correction of the mold on the basis of a result of measurement of the temperature of the mold by controlling the temperature within the housing and using a temperature sensor.

Further, in the case where the size correction of the mold is effected only from the side surface side of the mold, as described in U.S. Pat. No. 6,696,220, it is expected that peripheral members of the chucking mechanism is increased in size in order to support a reaction force during compression and deformation of the mold. However, according to the present invention, it is possible to reduce the size.

Embodiment 2

In Embodiment 2, a pressure processing mold, capable of effecting partial correction of a size of the entire mold by applying the present invention, is prepared. In this embodiment, a description of portions in common with those in Embodiment 1 is omitted, and only portions different therefrom are described.

Figure 5A:
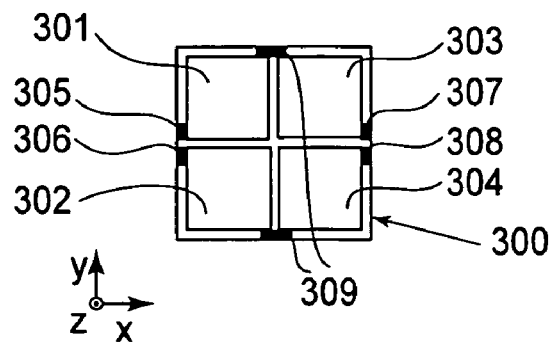
Figure 5B:
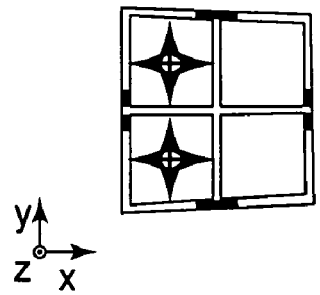
Figure 5C:
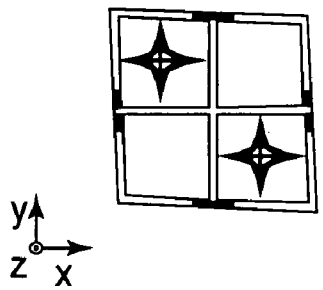
Figure 5D:
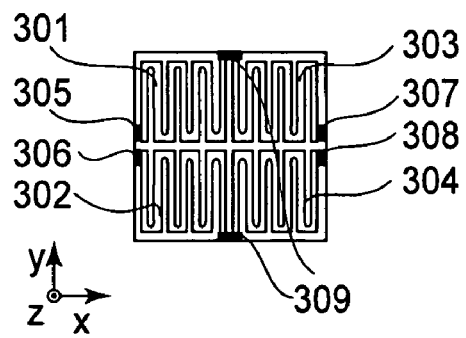

FIGS. 5A and 5D show a constitution of a mold in this embodiment, wherein FIG. 5A is a schematic view of the mold viewed from a back surface side in a direction parallel to a processing surface of the mold (contacting work).

The difference in constitution of this embodiment from Embodiment 1 is that the light-transmissive resistive layer is divided into four portions, in the plane, including a light-transmissive resistive layer (a) 301, a light-transmissive resistive layer (b) 302, a light-transmissive resistive layer (c) 303, and a light-transmissive resistive layer (d) 304, which are provided with an electrode (a) 305, an electrode (b) 306, an electrode (c) 307, and an electrode (d) 308, respectively, for electrical connection. Further, common electrodes 309 are provided between the light-transmissive resistive layers (a) 301 and (b) 302 and between the light-transmissive resistive layers (c) 303 and (d) 304, and always kept at a certain electrical potential, e.g., by grounding, etc.

Next, an example of a process for producing a mold 300 in this embodiment will be described.

First, the square quartz wafer constituting the pattern layer is covered with a metal mask at four sides thereof and at a central cross portion as shown in FIG. 5A, and a layer of ITO is formed in a film by sputtering as the light-transmissive resistive layers (a) to (d).

Next, a layer of good resulting in the respective electrodes is formed by vacuum deposition in a film after portions, other than the electrode portions, are covered with a metal mask, followed by polishing, until the electrodes have the same height (thickness) as that of the light-transmissive resistive layers. Otherwise, the same preparation process as that in Embodiment 1 is effected.

FIG. 5D shows a constitutional example of the light-transmissive resistive layer (a) 301 to the light-transmissive resistive layer (d) 304 used in this embodiment.

In this embodiment, each light-transmissive resistive layer is formed in a folded shape, as shown in FIG. 5D. The light-transmissive resistive layer having such a folded shape may be formed, similarly as in Embodiment 1, by using a folded shaped mask during the ITO film formation or effecting such patterning after the ITO film formation. By forming the folded-shaped light-transmissive resistive layer, it is possible to make uniform an amount of electrical current flowing at respective portions. As a result, similarly as in Embodiment 1, a production cost of the mold is somewhat increased, but an effective constitution for making uniform an amount of heat generation can be ensured.

In this embodiment, the apparatus has substantially the same constitution as in Embodiment 1, except that the correction contact 206 is disposed so as to be electrically connected with respective electrodes, shown in FIG. 5A, individually.

The pressure processing process in this embodiment is also basically similar to that in Embodiment 1, but a manner of deformation (expansion or contraction) is different. The difference will be described with reference to FIGS. 5B and 5C.

FIG. 5B shows a state, of the mold 300 having the constitution shown in FIG. 5A, in which only the light-transmissive resistive layer (a) 301 and the light-transmissive resistive layer (b) 302 are energized. In this state, only the energized light-transmissive resistive layers (a) 301 and (b) 302 are caused to generate heat, so that only associated portions, of the pattern layer, contacting the light-transmissive resistive layers are thermally expanded. As a result, the mold 300 is deformed in a trapezoidal shape, as shown in FIG. 5B.

FIG. 5C shows a state of the mold 300 having the constitution shown in FIG. 5A, in which only the light-transmissive resistive layer (a) 301 and the light-transmissive resistive layer (d) 304 are energized. In this state, only the energized light-transmissive resistive layers (a) 301 and (d) 304 are caused to generate heat, so that only associated portions, of the pattern layer, contacting the light-transmissive resistive layers are thermally expanded. As a result, the mold 300 is deformed in a rhombic shape, as shown in FIG. 5C.

According to this embodiment, for example, when the same electrical current is passed through the four light-transmissive resistive layer (a) 301 to (d) 304, similarly as in Embodiment 1, the entire mold 300 can be deformed isotropically. Further, for example, when half of the electrical current to be passed through the light-transmissive resistive layer (a) 301 and the light-transmissive resistive layer (d) 304 is passed through the light-transmissive resistive layer (b) 302 and the light-transmissive resistive layer (c) 303, the mold 300 can be deformed in a trapezoidal shape, while being expanded as a whole. It is also possible to deform the mold 300 in further complicated shapes by appropriately controlling an amount of electrical current passed through each of the light-transmissive resistive layer (a) 301 to the light-transmissive resistive layer (d) 304.

According to the above-described constitutions of this embodiment, the mold can be deformed in complicated shapes, so that the constitutions are particularly suitable for the case of requiring overlapping between the layers at high accuracy or the case of a larger anisotropy in deformation (expansion or contraction) of the work during other processing steps.

Embodiment 3

In Embodiment 3, a pressure processing mold, capable of effecting correction of a size of the entire mold by applying the present invention in a manner different from those in Embodiments 1 and 2, is prepared.

Figure 6A:
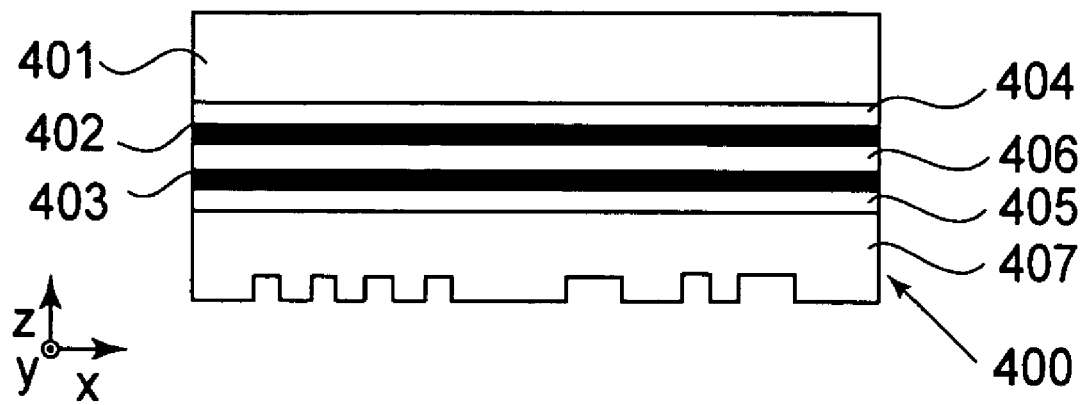
Figure 6B:
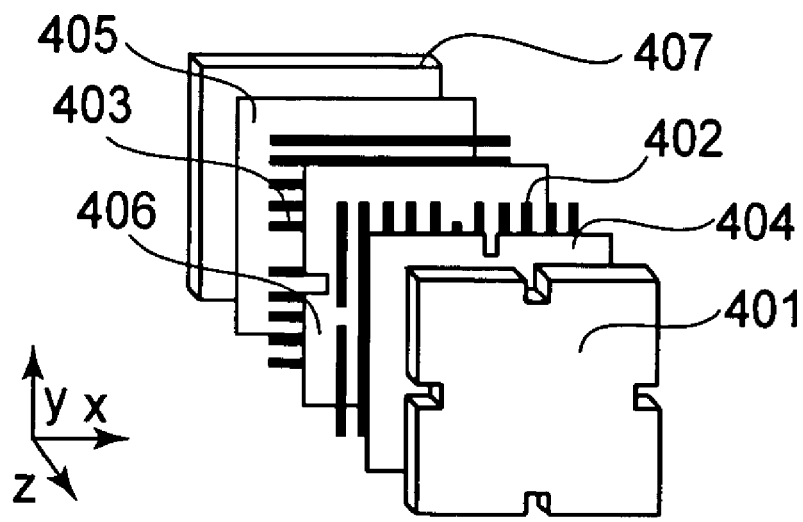

FIGS. 6A and 6B show a constitution of a mold in this embodiment, wherein FIG. 6A is a schematic view of the mold viewed in a direction parallel to a processing surface of the mold (contacting work) and FIG. 6B is a schematic perspective view of divided layers constituting the mold for illustrating constitutional members of the mold.

At a processing surface of a light-transmissive pattern layer 407, a desired shape is provided as minute projections or recesses. On an opposite side from the processing surface, light-transmissive members formed of a piezoelectric element, including an x-deformable electrode 405, an x-deformable layer 403, a common electrode 406, a y-deformable layer 402, and a y-deformable electrode 404, are integrally formed with the pattern layer 407, in this order, and thereon, a support layer 401 is formed of the same material and in the same thickness as that of the pattern layer 407.

Next, an example of a process for producing a mold 400 in this embodiment will be described.

First, a quartz wafer constituting the pattern layer 407 is cut into a square and thereon, a layer of ITO is formed in a film at the entire surface of the pattern layer 407 by sputtering, as the x-deformable electrode 405.

Next, a layer of $SiO_2$ is formed in a film and thereon, a stripe-like resist pattern arranged in the y direction in FIG. 6B is formed by photolithography. The $SiO_2$ layer is subjected to dry etching by using the resist pattern as a mask, whereby the x-deformable electrode 405 is exposed in a stripe shape.

Then, on the x-deformable electrode 405, the x-deformable layer 403 of lead zirconate titanate (PZT) is formed by sputtering in a thickness of not less than the thickness of the $SiO_2$ layer, and then is subjected to polishing, so that it has the same height (thickness) as that of the $SiO_2$ layer. The final thickness of the PZT layer is determined as a thickness permitting transmission of light in an amount required for the processing.

Thereafter, the common electrode 406 is formed in the same manner as in the x-deformable electrode 405, and then, the y-deformable layer 402 arranged in the x direction in FIG. 6B is formed in the same manner as in the x-deformable layer 403. Next, the y-deformable electrode 404 is formed in the same manner as in the x-deformable electrode 405. Finally, onto the y-deformable electrode 404, the support layer 401 is applied. Incidentally, in order to ensure electrical connection with the respective electrode layers, the respective layers are provided with cut portions. Further, the common electrode 406 is grounded, and a high voltage is applied to the x-deformable electrode 405 and the y-deformable electrode 404, so that the x-deformable layer 403 and the y-deformable layer 402 are polarized to complete the mold, as shown in FIGS. 6A and 6B.

Incidentally, the materials and the processing methods for the respective members are not limited to those described above. For example, it is also possible to use, in place of the quartz wafer, a substrate of another light-transmissive material, such as a sapphire substrate. Further, instead of ITO, another light-transmissive electrode material, such as IZO, can also be used. Alternatively, a layer of a metallic material, such as Al, may be formed in a thin film so that it permits transmission of a necessary amount of light. The deformable layers may also be formed of a ferroelectric material, such as ZnO.

Further, it is also possible to apply a desired method, such as FIB processing or cutting, in place of the photolithography.

In this embodiment, the apparatus has substantially the same constitution as that in Embodiment 1 and Embodiment 2, except that the correction contact 206 is disposed so as to be electrically connected with respective electrodes, shown in FIGS. 6A and 6B, individually.

The pressure processing process in this embodiment is also basically similar to that in Embodiment 1 and Embodiment 2, but a manner of deformation (expansion or contraction) is different. The difference will be described below.

In this embodiment, at the processing surface of the pattern layer 407 of the mold for the second layer, a pattern, generally increased in size, which is larger than an estimated amount of deformation (expansion or contraction) of the pattern occurring in the first layer forming step with respect to the mold for the first layer, is prepared.

The correction amount control circuit 212 applies a voltage corresponding to the detected deformation amount to the x-deformable electrode 405 and the y-deformable electrode 404. The common electrode 406 is always kept at a certain electrical potential by, e.g., grounding.

The x-deformable layer 403 and the y-deformable layer 402 are expanded or contracted principally in the x-direction (in one direction parallel to the processing surface of the pattern layer) and the y-direction (in a direction parallel to the processing surface of the pattern layer and perpendicular to the x-direction, respectively), depending on an intensity and a direction of electrical field among the x deformable electrode 405, the y-deformable electrode 404, and the common electrode 406. As a result, the pattern layer 407 can be expanded or contracted in the x-direction or y-direction as a whole. Incidentally, a force for deformation (expansion or contraction) is generated in each deformable layer, so that there is a possibility that the entire mold is deformed in a curved plane shape. In this embodiment, however, the support layer 401 is disposed opposite from the pattern layer 407, thus preventing deformation in a direction other than the in-plane direction of the processing surface. Incidentally, e.g., in the case where the deformation amount exceeds the estimated amount, similarly as in Embodiment 1, it is also possible to accommodate such a case by contracting the mold during the processing of the first layer without remaking the mold for the second layer (and subsequent layer), although the direction of deformation is opposite from that in Embodiment 1.

According to the constitution of this embodiment, it is possible to control the deformation of the mold in two directions independently, so that the constitution is suitable for such a case that there is a large anisotropy in deformation of the work during other processing steps. Further, during contraction of the mold, it is possible to suppress the generation of heat, so that the constitution of this embodiment is particularly suitable for, e.g., processing using a resin having a severe temperature condition, such that a viscosity or a sensitivity is abruptly changed with temperature.

While the invention has been described with reference to the structures disclosed herein, it is not confined to the details set forth, and this application is intended to cover such modifications or changes as may come within the purpose of the improvements or the scope of the following claims.

What is claimed is:

1. A deformable mold comprising:
   a first surface at which an imprinting pattern is formed, the imprinting pattern (i) being used to imprint a pattern on a substrate and (ii) having a variable size, which varies based on an amount of deformation of the imprinting pattern;

a second surface located opposite from said first surface in a direction of thickness of said mold;

a plurality of heat generating members for generating heat, said plurality of heat generating members having a permeability to ultraviolet light and being disposed at one of (i) said second surface and (ii) between said first surface and said second surface, and said plurality of heat generating members directly contacting said mold in order to control the amount of deformation of the imprinting pattern to vary the size of the imprinting pattern; and a controller for independently controlling said plurality of heat generating members, wherein said controller controls at least one of said heat generating members so as to effect anisotropic size correction of the mold in an in-plane direction of the mold.

2. A mold according to claim 1, wherein said mold is configured to correct a size of the imprinting pattern by heat conduction from said plurality of heat generating members to the imprinting pattern.

3. A mold according to claim 1, wherein said plurality of heat generating members is provided in an in-plane direction of said first surface.

4. A mold according to claim 1, wherein said mold further comprises an electrode for sending an electrical current to said plurality of heat generating members.

5. A mold according to claim 4, wherein the electrode is provided in a plurality of electrodes, which are laminated in a direction perpendicular to said first surface.

6. A pattern transfer apparatus comprising:

a mold holding portion for holding a mold according to claim 1;

a control portion for controlling an amount of electrical current to be passed through said plurality of heat generating members; and a support portion for supporting a member to be processed onto which the imprinting pattern of said mold is transferred.

7. A pattern forming method of forming a pattern on a member to be processed using an imprinting pattern provided on a mold, said method comprising:

preparing a mold according to claim 1;

preparing the member to be processed disposed opposite to the mold;

adjusting a size of the mold using the plurality of heat generating members; and causing the imprinting pattern provided on the mold to contact the member to be processed.

8. A mold according to claim 1, wherein each of said plurality of heat generating members is a heat generating film.

9. A mold according to claim 1, wherein each of said plurality of heat generating members is a resistive film.

10. A semiconductor device manufacturing method comprising:

preparing a mold according to claim 1; and transferring the imprinting pattern of the mold onto a resin material on a member to be processed.

11. A method according to claim 10, further comprising:

etching the member to be processed by using, as a mask, the imprinting pattern transferred on the resin material.

12. A method according to claim 10, further comprising:

subjecting the member to be processed to ion implantation by using, as a mask, the imprinting pattern transferred onto the resin material.

* * * * *